(12) United States Patent
Chen

(10) Patent No.: US 7,093,183 B2
(45) Date of Patent: Aug. 15, 2006

(54) SYMBOL LEVEL ERROR CORRECTION CODES WHICH PROTECT AGAINST MEMORY CHIP AND BUS LINE FAILURES

(75) Inventor: Chin-Long Chen, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 1125 days.

(21) Appl. No.: 09/795,216

(22) Filed: Feb. 28, 2001

(65) Prior Publication Data
US 2002/0188909 A1    Dec. 12, 2002

(51) Int. Cl.
*H03M 3/00* (2006.01)
(52) U.S. Cl. .................................... 714/785
(58) Field of Classification Search ........... 714/785, 714/793, 737, 755–756, 757–758, 766, 767
See application file for complete search history.

(56) References Cited

U.S. PATENT DOCUMENTS 4,525,838 A * 6/1985 Patel ..................... 714/755

5,600,659 A * 2/1997 Chen ..................... 714/752

OTHER PUBLICATIONS

Gui-Liang Feng et al. 'A new procedure for decoding cyclic and BCH codes up to actual minimum distance,'IEEE Transaction on Information Theory, Sep. 1994, pp. 1364-1374, vol. 40, Issue: 5.*

* cited by examiner

*Primary Examiner*—Guy J. Lamarre
(74) *Attorney, Agent, or Firm*—William A. Kinnaman, Jr.; Lawrence D. Cutter

(57) ABSTRACT

Error correction and detection codes are designed with several properties: the ability to perform error correction and detection operations via syndrome generation in multiple cycles of information delivery from a source such as a set of memory chips; a code structure which is cooperatively designed in terms of the bits-per-chip architecture of a set of memory chips so as to provide enhanced robustness in the face of bus line and chip failures; and a structured parity check matrix which provides circuits which are cheaper, take up less room, and are faster than standard designs.

15 Claims, 3 Drawing Sheets

SYMBOL LEVEL ERROR CORRECTION CODES WHICH PROTECT AGAINST MEMORY CHIP AND BUS LINE FAILURES

BACKGROUND OF THE INVENTION

The present invention is generally directed to symbol level error correction coding and decoding methods and circuits. More particularly the present invention is directed to a symbol level code which exhibits error correction and detection advantages insofar as there is a reduction in circuit complexity. The present code is also structured so as to provide improved error correction and detection features in the face of memory chip and/or bus line failures.

The IBM iSeries server is a computer system designed and manufactured by the assignee of the present invention. It has been found that there is a need for a memory controller which is required to support 65 data bits using standard 72 bit DIMMs (Dual In-line Memory Modules). The SDRAM chips that are employed in this design are configured to provide as output, and also to receive for storage, 4 bits per chip. The error correction code (ECC) that is desired for this system should be able to correct all errors generated from single chip failures and to detect all errors generated from double chip failures. A single symbol error correcting and double symbol error detecting (SSC-DSD) code for 4 bits per symbol and 65 data bits requires a minimum of 14 check bits. The ECC word for such a code would require 79 bits, a quantity sufficiently high so as to exceed the 72 bit limitation on the DIMMs to be used. Using two DIMMS with 130 data bits would leave 14 bits for ECC check bits (72'2-65'2). However, SSC-DSD codes with 15 check bits and 130 data bits for 4 bits per symbol do not exist.

More generally, for a memory array configured using an m-bit-per-chip structure, the ability for an ECC circuit to correct multi-bit errors (symbol errors) generated from chip-kills or from half chip-kills becomes an important factor in the ECC design. For memory reliability and for data integrity, the class of SSC-DSD (single symbol error correcting and double symbol error detecting) codes are very much desired, where a symbol error is an m-bit error pattern that can be generated from a chip failure in an m-bit-per-chip memory configuration.

SUMMARY OF THE INVENTION

In a preferred embodiment of the present invention an SSC-DSD code with 8 bits per symbol and 24 check bits is designed, structured and employed. In another feature of the present invention, ECC words are accessed from two DIMMs in two installments (two cycles). This provides a (288, 264) code of length 288 with 264 data bits (n=288 and k=264 with n−k=24). If desired, this code can be shortened by not using some of the data bits. In the desired IBM iSeries server implementation, the actual number of data bits used is 260 plus 2 address parity bits that participate in the check bit calculation but which are not actually stored in the memory chips. An ECC word is transferred to and from the memory in two installments or cycles. An 8-bit symbol of the ECC word is also transferred to and from the memory chip in two installments. In addition, an 8-bit symbol is stored in the same memory chip. The ECC also provides bus line failure protection since any bus line failure results in 0, 1 or 2 erroneous bits within an 8-bit symbol.

The ECC invention includes: (1) a construction of a (288,264) SSC-DSD code with 8 bits per symbol; (2) a structure for grouping ECC encoded bits for the memory chips and the data bus lines between the memory controller and the DIMMs so that all single failures in the memory chips and bus lines are correctable and double failures are detectable; (3) a process and circuit to generate partial check bits and syndrome bits as soon as the first installment of the data transfer is completed. This cuts down on the number of circuits required; and (4) a syndrome decoding process that saves hardware as compared to other state-of-the-art schemes. Syndrome decoding includes the determination of the symbol error position and the symbol error pattern, if there is one symbol error in the received word, and the generation of a UE (uncorrectable errors) signal.

Accordingly, it is an object of the present invention to provide a digital coding and decoding process and circuit for implementing single symbol correction and double symbol detection in an efficient manner which makes best use of available hardware.

It is also an object of the present invention to provide a coding method which transfers data from memory chips or from other sources in two (or more) cycles.

It is a still further object of the present invention to provide decoding and syndrome generation circuits which are simpler and less expensive to implement, especially when the cost of implementation is measured in chip real estate.

It is yet another object of the present invention to provide a new syndrome decoding method.

It is yet another object of the present invention to provide a simplified form for circuits which provide an indication that an uncorrectable error has occurred.

It is also an object of the present invention to provide an error correction and detection system in which chip failures and/or bus line failures do not cause uncorrectable errors.

It is a still further object of the present invention to provide enhanced single symbol error correction codes, methods and circuits and to also provide correspondingly enhanced codes, methods and circuits for double symbol error detection.

Lastly, but not limited hereto, it is object of the present invention to provide improved memory performance and capacity in computer and other data processing systems.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
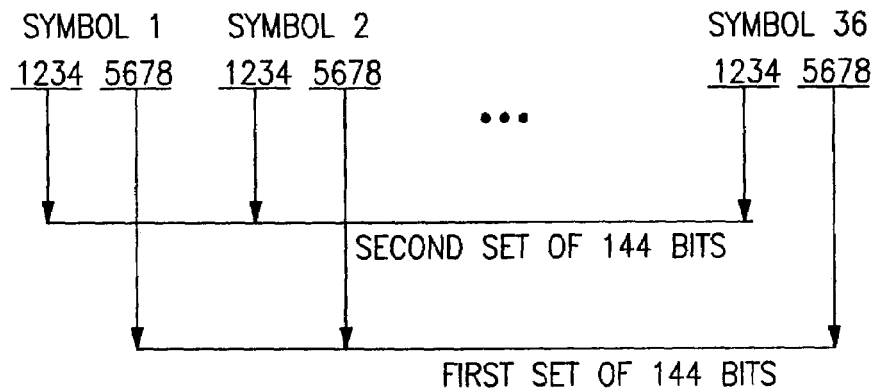
FIG. 1 is a diagram illustrating the order in which symbol bits are processed in accordance with an embodiment of the present invention employing a two-cycle operation.

The present application describes the design of a (288, 264) SSC-DSD code with 8 bits per symbol. First the ECC matrix is specified. Next, a scheme for sequential generation of check bits and syndrome bits is described. The scheme is designed for situations in which each data transfer is accomplished in two cycles and is thus designed to save logic circuitry especially when compared to conventional parallel generation methods. Also, a new scheme for the decoding of a syndrome into symbol error locations and symbol error patterns is described. The new syndrome decoding scheme also saves logic circuitry as compared to the conventional scheme. Finally, a scheme for the generation of uncorrectable errors is described.

First is considered the SSC-DSD ECC matrix structure. An ECC parity check matrix or H-matrix is used to represent the parity-check equations that each ECC word should satisfy. The matrix is also used to specify the Exclusive-OR gate (XOR gate) logic for the generation of ECC check bits and for the generation of syndrome bits. The result of the XOR of those bits of an ECC word corresponding to the ones in a row vector of the H-matrix is always intended to be equal to 0. Mathematically, if $\underline{V}$ is a binary vector representing an ECC word, then the product of the ECC matrix H and the transpose of $\underline{V}$ is an all zeros vector, that is, $$H \cdot \underline{V}^t = 0 \bmod 2. \qquad \text{(Equation 1)}$$

From the parity-check equations, the values of check bits can be calculated from the data bits through XOR operations. The data bits, together with the corresponding check bits, form an ECC word to be stored in memory. On the other hand, when an ECC encoded word is fetched from memory, the parity-check equations are used to generate the syndrome that represents the validity of the received data.

In general, suppose that $p(x) = a_0 + a_1 x + a_2 x^2 + \ldots + a_{m-1} x^{m-1} + x^m$ is a binary primitive polynomial, and let $\alpha$ be a root of $p(x)$ in the finite field $GF(2^m)$ of $2^m$ elements. The companion matrix of $\alpha$ is defined to be:

$$T = \begin{bmatrix} 0 & 0 & 0 & 0 & \cdots & 0 & a_0 \\ 1 & 0 & 0 & 0 & \cdots & 0 & a_1 \\ 0 & 1 & 0 & 0 & \cdots & 0 & a_2 \\ \cdots & \cdots & \cdots & \cdots & \cdots & \cdots & \cdots \\ \cdots & \cdots & \cdots & \cdots & \cdots & \cdots & \cdots \\ 0 & 0 & 0 & 0 & \cdots & 1 & a_{m-1} \end{bmatrix}.$$

And for the particular case in which $p(x) = 1 + x + x^6 + x^7 + x^8$, the companion matrix is specified as follows:

$$T = \begin{bmatrix} 00000001 \\ 10000001 \\ 01000000 \\ 00100000 \\ 00010000 \\ 00001000 \\ 00000101 \\ 00000011 \end{bmatrix}. \qquad \text{(Equation 2)}$$

Certain powers of T are used to represent the elements of the ECC H-matrix. The powers, $T^i$ are companion matrices of the non-zero finite field elements $\alpha^i, 0 \leq i \leq 254$. In addition, each $\alpha^i$ is expressed as an 8-binary (column) vector.

A (288, 264) SSC-DSD code with 24 check bits (3 symbols) and 264 data bits (33 symbols) for a total of 288 bits (36 symbols) is constructed and specified by the H-matrix of the form:

$$H = [M_1 M_2 I_{24}], \qquad \text{(Equation 3)}$$

where $M_1$ is:

$$\begin{vmatrix} I & I & I & I & I & I & I & I & I & I & I & I & T^2 & T^{49} & T^{50} & T^{51} & T^{227} \\ I & T & T^2 & T^3 & T^4 & T^{156} & T^{157} & T^{158} & T^{159} & T^{251} & T^{252} & T^{254} & I & I & I & I & I \\ T^{56} & T^{55} & T^{54} & T^{53} & T^{52} & T^{155} & T^{154} & T^{153} & T^{152} & T^{60} & T^{59} & T^{57} & T^{60} & T^{154} & T^{156} & T^{158} & I \end{vmatrix}$$

and where $M_2$ is:

$$\begin{vmatrix} I & I & I & I & I & I & I & I & I & I & I & I & T^2 & T^{49} & T^{50} & T^{51} \\ T^{56} & T^{55} & T^{54} & T^{53} & T^{52} & T^{155} & T^{154} & T^{153} & T^{152} & T^{60} & T^{59} & T^{57} & T^{60} & T^{154} & T^{156} & T^{158} \\ I & T & T^2 & T^3 & T^4 & T^{156} & T^{157} & T^{158} & T^{159} & T^{251} & T^{252} & T^{254} & I & I & I & I \end{vmatrix}$$

I is an 8×8 identity matrix, $I_{24}$ is a 24×24 identity matrix, and the powers of T are explicitly shown in Table 1 set forth below. Note that the last two rows of $M_2$ are a permutation of the last two rows of the first 16 columns of $M_1$. This permutation property is used for modular implementation in syndrome generation and in syndrome decoding.

In this example, the first 33 symbol positions of an ECC word are designated as data symbols and the last 3 symbol positions are designated as check symbols. The H-matrix is also be representable as $H=[H_1, H_2, \ldots, H_{36}]$, where each $H_1$ is a 24×8 binary matrix and is called a symbol column. Note that each symbol column consists of three 8×8 submatrices, one of which is an identity matrix. This property is designed so that a symbol error pattern is easily identifiable in syndrome based decoding. All 8 bits in the same symbol are assumed to be stored in the same memory array chip.

Being an SSC-DSD code, the H-matrix of Equation 3 has following properties:
 a. The column vectors of each symbol column are linearly independent;
 b. The dimension of the space spanned by the column vectors of any two symbol columns is 16;
 c. The dimension of the space spanned by the column vectors of any three symbol columns is 24.

If the number of data bits k is less than 264, the ECC can be shortened by deleting some binary columns from the data portion of the H-matrix. For example, if the number of data bits is k=256, the last symbol column (consisting of 8 binary columns) of $M_1$ may be deleted from the H-matrix to form a (280, 256) SSC-DSD code. If the number of data bits is k=260, bit positions 3, 4, 7, 8 of the last symbol column of $M_1$ may be deleted from the H-matrix to form a (284, 260) SSC-DSD code.

Next is considered the sequential generation of ECC bits and syndrome bits. Before a set of k data bits is stored into the memory, a set of r=24 check bits is generated according to the parity-check equations defined in (1–3). The r check bits and the k data bits form an encoded ECC word of n=r+k bits to be stored in the memory. On the other hand, when an n-bit word is fetched from the memory, it is check against the left-hand side of (1). The resultant vector is called the syndrome of the received word. The syndrome is logically the XOR of the received check bits and the check bits generated from the received data bits. The generation of check bits and the generation of syndrome can be implemented with the same logic.

Conventionally, ECC check bits and syndrome bits are generated in parallel by a set of independent XOR circuits according to the equations specified by the H-matrix. For example, check bit 1 is the XOR of the following data bits:
 1, 9, 17, 25, 33, 41, 49, 57, 65, 73, 81, 89, 103, 104, 107, 108, 109, 114, 115, 116, 121, 122, 123, 128, 129, 133, 134, 135, 136, 137, 145, 153, 161, 169, 177, 185, 193, 201, 209, 217, 225, 239, 240, 243, 244, 245, 250, 251, 252, 257, 258, 259, 264, 265.

In an application where ECC words are transferred between the memory array and the memory controller in 2 installments or cycles, partial results are calculated in the generation of check bits or syndrome bits once the first set of data has been received. Based on this concept, a sequential ECC generation scheme is described herein. The generation of ECC check bits or syndrome bits is accomplished in two cycles at the memory controller. Eight bits of a symbol are transferred four bits at time along four physical bus lines in two installments. Bus line failures are treated as symbol errors and thus are protected. The number of circuits required in the sequential scheme is only a little more than ½ of the that required of a parallel scheme.

The symbols of an ECC encoded word, in accordance with the present example, are numbered from 1 to 36 and from left to right. Within a symbol, the bits are numbered from 1 to 8 and also from left to right. The transferring order of each of the 36 symbols from 36 memory chips is bits 5 to 8, followed by bits 1 to 4. FIG. 1 shows the sequential order of the data inputs to the check bits and syndrome bits generator. For ECC check bit generation, symbols 34, 35, 36 are set to zeros before they are supplied to the generator.

Figure 2:
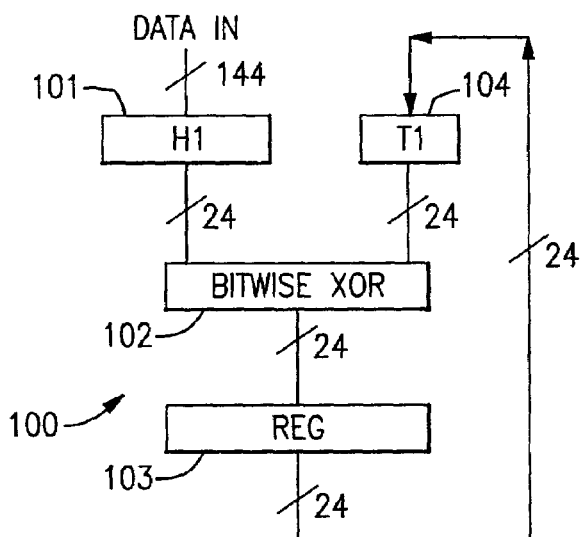
FIG. 2 is a block diagram of a circuit capable of performing check bit generation for a two-cycle mode of operation.

FIG. 2 is a block diagram for a circuit 100 for the generation of ECC check bits and also for the generation of syndrome bits. Initially, the 24-bit register REG (103), which stores the temporary result, is clear (contains zeros). In the first cycle, 144 input bits (taken from the last 4 bits of each of the 36 symbols) are fed into block 101 (as specified by matrix H1) of 24 XOR trees to generate the current result. The current result is then XORed, bit-by-bit, using block 102 of XOR gates, with the previous result, which is all zeros at this moment, multiplied by in circuit 104 as specified by block T1 to yield the new current result which is stored in REG. Multiplication by T1 is really just a specification for a set of XOR operations to be performed on a selectively defined set of bits. In the next cycle, the second set of 144 input bits (taken from the first 4 bits of each of the 36 symbols) is fed into the multiplier block specified by H1. (And again, for emphasis, H1 provides a one-to-one mapping between ones and zeros in the H1 matrix and XOR circuit elements, with one such XOR tree for each binary row of H1. Each XOR tree is preferably implemented in a balanced fashion to minimize both the delay and the number of circuits employed.) The result is then XORed with the previous result, multiplied by T1 and is stored in REG, which now contains the final result. The input-output relation of the multiplication block T1 is shown in Table 2 below. If the 24 input bits are divided into three sets of 8-bit vectors, then each set of the 8-bit outputs is the product of $T^4$ by the corresponding set of 8-bit inputs.

The XOR trees of H1 are specified in Table 3 set forth further below. Matrix H1 is obtained from matrix H of Equation 3 by dropping the last 4 binary columns from each of the 36 symbol columns. Specifically, the output bits are obtained from the following equations:

Output bit 1=XOR of the following input bits:
1, 5, 9, 13, 17, 21, 25, 29, 33, 37, 41, 45, 55, 56, 58, 59, 60, 61, 62, 63, 65, 69, 73, 77, 81, 85, 89, 93, 97, 101, 105, 109, 113, 123, 124, 126, 127, 128, 129, 130, 131, 133

Output bit 2=XOR of the following input bits:
2, 6, 10, 14, 18, 22, 26, 30, 34, 38, 42, 46, 55, 58, 61, 64, 65, 66, 70, 74, 78, 82, 86, 90, 94, 98, 102, 106, 110, 114, 123, 126, 129, 132, 134

Output bit 3=XOR of the following input bits:
3, 7, 11, 15, 19, 23, 27, 31, 35, 39, 43, 47, 49, 53, 56, 59, 62, 65, 66, 67, 71, 75, 79, 83, 87, 91, 95, 99, 103, 107, 111, 115, 117, 121, 124, 127, 130, 135

Output bit 4=XOR of the following input bits:
4, 8, 12, 16, 20, 24, 28, 32, 36, 40, 44, 48, 50, 54, 57, 60, 63, 66, 67, 68, 72, 76, 80, 84, 88, 92, 96, 100, 104, 108, 112, 116, 118, 122, 125, 128, 131, 136

Output bit 5=XOR of the following input bits:
51, 53, 55, 58, 61, 64, 65, 67, 68, 119, 121, 123, 126, 129, 132

Output bit 6=XOR of the following input bits:
52, 54, 56, 57, 59, 62, 66, 68, 120, 122, 124, 125, 127, 130

Output bit 7=XOR of the following input bits:
53, 56, 59, 62, 67, 121, 124, 127, 130

Output bit 8=XOR of the following input bits:
54, 55, 56, 57, 58, 59, 61, 62, 68, 122, 123, 124, 125, 126, 127, 129, 130

Output bit 9=XOR of the following input bits:
54, 55, 56, 57, 58, 59, 61, 62, 68, 122, 123, 124, 125, 126, 127, 129, 130

Output bit 10=XOR of the following input bits:
2, 5, 22, 23, 25, 26, 29, 47, 50, 54, 58, 62, 66, 71, 76, 77, 82, 87, 91, 92, 96, 101, 105, 110, 114, 116, 117, 124, 126, 127, 129, 138

Output bit 11=XOR of the following input bits:
3, 6, 9, 23, 24, 26, 27, 29, 30, 33, 37, 48, 51, 55, 59, 63, 67, 72, 73, 78, 83, 85, 88, 92, 97, 101, 102, 106, 109, 111, 115, 118, 127, 128, 129, 130, 139

Output bit 12=XOR of the following input bits:
4, 7, 10, 13, 24, 27, 28, 30, 31, 33, 34, 38, 41, 52, 56, 60, 64, 68, 69, 74, 79, 81, 84, 86, 93, 97, 98, 101, 102, 103, 105, 107, 110, 112, 116, 117, 119, 121, 128, 130, 131, 140

Output bit 13=XOR of the following input bits:
8, 11, 14, 17, 28, 31, 32, 34, 35, 37, 39, 42, 70, 75, 77, 80, 82, 87, 89, 93, 94, 97, 98, 99, 102, 103, 104, 106, 108, 111, 113, 118, 120, 121, 122, 131, 132

Output bit 14=XOR of the following input bits: 12, 15, 18, 21, 32, 35, 36, 37, 38, 40, 41, 43, 45, 71, 73, 76, 78, 83, 85, 88, 89, 90, 93, 94, 95, 98, 99, 100, 103, 104, 107, 112, 114, 119, 121, 122, 123, 125, 132

Output bit 15=XOR of the following input bits:
16, 19, 21, 36, 40, 43, 45, 69, 71, 74, 76, 79, 84, 85, 89, 90, 94, 95, 99, 100, 104, 108, 114, 120, 122, 123, 125

Output bit 16=XOR of the following input bits:
20, 21, 37, 38, 39, 40, 41, 42, 43, 45, 70, 71, 75, 76, 80, 85, 90, 95, 100, 113, 114, 123, 125

Output bit 17=XOR of the following input bits:
3, 4, 8, 13, 17, 18, 23, 28, 41, 46, 47, 56, 58, 65, 69, 90, 93, 105, 106, 107, 108, 109, 110, 111, 112, 113, 114, 117, 121, 125, 129, 141

Output bit 18=XOR of the following input bits:
3, 8, 9, 14, 19, 23, 24, 28, 33, 37, 42, 46, 48, 49, 56, 58, 59, 61, 66, 70, 73, 90, 91, 93, 94, 97, 115, 118, 122, 126, 130, 142

Output bit 19=XOR of the following input bits:
4, 5, 10, 15, 17, 20, 24, 29, 33, 34, 38, 41, 43, 47, 50, 59, 60, 61, 62, 67, 71, 74, 77, 91, 92, 94, 95, 97, 98, 101, 105, 116, 119, 123, 127, 131, 143

Output bit 20=XOR of the following input bits:
1, 6, 11, 13, 16, 18, 25, 29, 30, 33, 34, 35, 37, 39, 42, 44, 48, 49, 51, 53, 60, 62, 63, 68, 72, 75, 78, 81, 92, 95, 96, 98, 99, 101, 102, 106, 109, 120, 124, 128, 132, 144

Output bit 21=XOR of the following input bits:
2, 7, 9, 12, 14, 19, 21, 25, 26, 29, 30, 31, 34, 35, 36, 38, 40, 43, 45, 50, 52, 53, 54, 63, 64, 76, 79, 82, 85, 96, 99, 100, 102, 103, 105, 107, 110

Output bit 22=XOR of the following input bits:
3, 5, 8, 10, 15, 17, 20, 21, 22, 25, 26, 27, 30, 31, 32, 35, 36, 39, 44, 46, 51, 53, 54, 55, 57, 64, 80, 83, 86, 89, 100, 103, 104, 105, 106, 108, 109, 111, 113

Output bit 23=XOR of the following input bits:
1, 3, 6, 8, 11, 16, 17, 21, 22, 26, 27, 31, 32, 36, 40, 46, 52, 54, 55, 57, 84, 87, 89, 104, 108, 111, 113

Output bit 24=XOR of the following input bits:
2, 3, 7, 8, 12, 17, 22, 27, 32, 45, 46, 55, 57, 88, 89, 105, 106, 107, 108, 109, 110, 111, 113

Next is considered the process and apparatus for syndrome decoding. When ECC encoded data $\underline{W}$ is received, the data is checked to see if the syndrome $S=H\cdot\underline{W}^t$ is an all zeros vector. If S is an all zeros vector, it is assumed that there is no error in $\underline{W}$. Otherwise, S is decoded to determine if the error or errors in $\underline{W}$ are correctable, and to determine the locations of the errors. In the following exemplary description, a syndrome S is divided into 3 components $S_1$, $S_2$, and $S_3$ so that $S=(S_1, S_2, S_3)$. Each of the components is an 8-bit binary vector and may be considered to be an element of $GF(2^8)$.

Let $E_1$ be the error pattern at symbol position i. In addition, let $L_1$ be the symbol error indicator for symbol i. The value of $L_1$ is "1" if and only if symbol i is in error.

Let $\underline{V}$ be an encoded ECC word that satisfies Equation 1, so that $\underline{W}=\underline{V}+\underline{E}$ (mod 2) be a version of codeword $\underline{V}$ corrupted by the error vector $\underline{E}=(E_1, E_2, \ldots, E_{36})$. Once the error vector $\underline{E}$ is determined from decoding the syndrome, the original vector $\underline{V}$ is recovered by easily computing (by modulo 2 summation with XOR gates): $\underline{V}=\underline{W}+\underline{E}$ (mod 2). From Equation 1, it is readily seen that the syndrome S is:

$$S = H\cdot\underline{W}^t = H\cdot(\underline{V}^t+\underline{E}^t) = H\cdot\underline{E}^t \bmod 2.$$

Furthermore, if the error vector consists of a single symbol error at position i, then:

$$S = H_1\cdot E_1^t \bmod 2.$$

For example, if i=13, the syndrome is:

$$S = \begin{bmatrix} T^2 \\ I \\ T^{60} \end{bmatrix} \cdot E_i^t \bmod 2.$$

Figure 3:
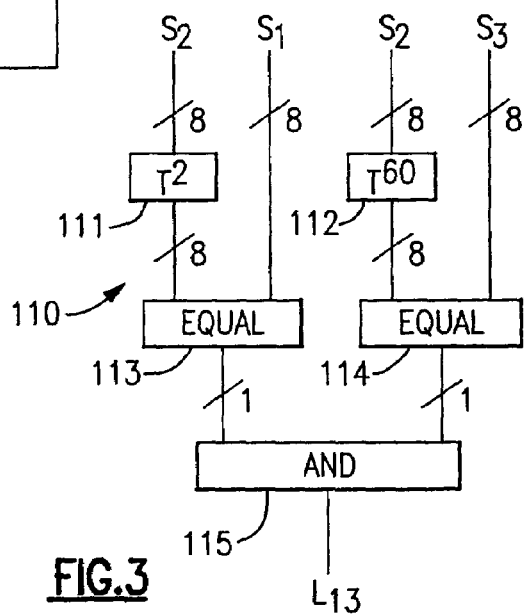
FIG. 3 is a block circuit diagram illustrating a standard form of syndrome generation for a particular symbol position.
Figure 4:
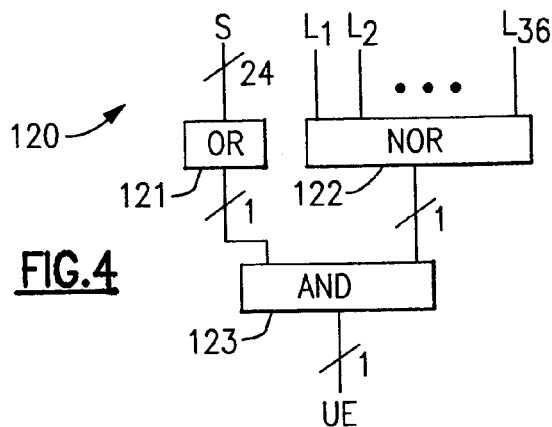
FIG. 4 is a block circuit diagram illustrating a standard for of a circuit for generating an indication that an uncorrectable error has occurred.

In this case, we have $S_1=T^2\cdot E_1^t$, $S_2=E_1^t$, $S_2=T^{60}\cdot E_1^t$. Thus, if $S_1=T^2\cdot S_2$ and $S_c=T^{60}\cdot S_2$, we set $L_{13}=1$, and $E_{13}=S_2^t$. FIG. 3 is a block diagram illustrating a circuit which employs the usual method used for syndrome decoding for symbol 13. This logical relationship is expressed in the circuits shown in FIG. 3. Block 111 is, as above, a set of XOR trees specified by the $T^2$ matrix. Likewise, block 112 is specified by the $T^{60}$ matrix. The outputs of these circuits are supplied to equivalence circuits 113 and 114 respectively for comparison with $S_1$ and $S_3$, also respectively. If both of the output signals from blocks 113 and 114 are "1," then the output of AND gate 115 indicates an error in symbol 13. All of the symbol error indicators are generated in a similar way. If the syndrome is non-zero and none of the symbol indicators generated in this fashion turns on, then the UE (uncorrectable error) signal is turned on, as shown in FIG. 4. Thus, UE generator 120 employs OR gate 121, NOR gate 122 and AND gate 123 connected as shown in FIG. 4 to carry out the indicated logical relationship described above.

Note that each of the symbol columns of $M_1$ and $M_2$ shown in Equation 3 consists of three submatrices. These three submatrices have the property that the product of the last two submatrices is equal to the product of $T^{56}$ and the square of the first submatrix. This property is described more symbolically as follows:

$$S_2 \cdot S_3 = T^{56} \cdot (S_1^2) \quad \text{(Equation 4)}$$

Figure 5:
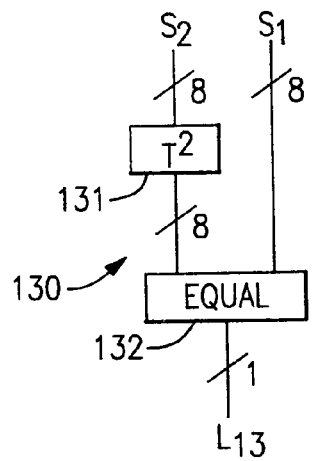
FIG. 5 is a block circuit diagram of a simplified syndrome generating circuit in accordance with coding methods set forth in the present invention.

If there is only one symbol error in the data symbol portion of the error vector E, then $S_2 \cdot S_3 = T^{56} \cdot (S_1^2)$ regardless of the data symbol error locations. In Equation 4, the 8-bit vector of the syndrome components are considered elements of the finite field $GF(2^8)$. That is, $S_1$, $S_2$, and $S_3$ are powers of $\alpha$. Equation 4 is used to check if a non-zero syndrome is a correctable symbol error syndrome and to simplify the syndrome decoding for error indicators. FIG. 5 illustrates an improved method for generating an error indication ($L_{13}$) for symbol 13. Circuit 130 in FIG. 5 only needs to employ the XOR tree 131 characterized by the matrix $T^2$, together with equivalence circuit 132. (Such equivalence circuits are the logical inverses of XOR gates.) This is a simpler circuit than that shown in FIG. 3. In general, to decode the syndrome for symbol position i, $S_{i_j}$ is assumed to be the error pattern where $i_j$ is the position of an identity submatrix at the $i^{th}$ syndrome column, and $L_i$, is set to be 1 if $S_{i_k} = T_{i_k} \cdot S_{i_j}$, where $i_k \neq i_j$, and the submatrix $T_{i_k}$ is a submatrix of the $i^{th}$ symbol column that requires the minimum number circuits to implement the multiplication. For example, for i=13, we have $i_j$=2 because the second submatrix of symbol column 13 is an identity matrix. Identity matrices will have the absolute minimum number of non-zero elements. Since the use of the matrix $T^2$ requires a fewer number of circuits to carry out the modulo 2 multiplication than $T^{60}$, $i_k$=1. Thus, if $S_1 = T^2 \cdot S_2$, and $E_{13} = S_2$, then $L_{13}$=1 indicating that there is an error in symbol position 13.

Figure 6:
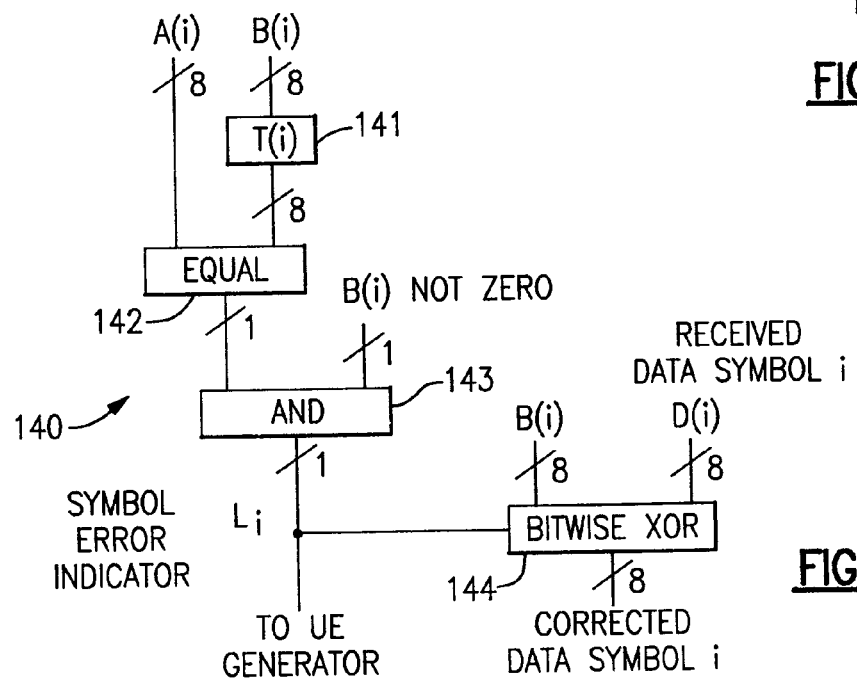
FIG. 6 is a block circuit diagram illustrating data symbol error correction in a circuit constructed in accordance with the coding methods set forth in the present invention.
Figure 7:
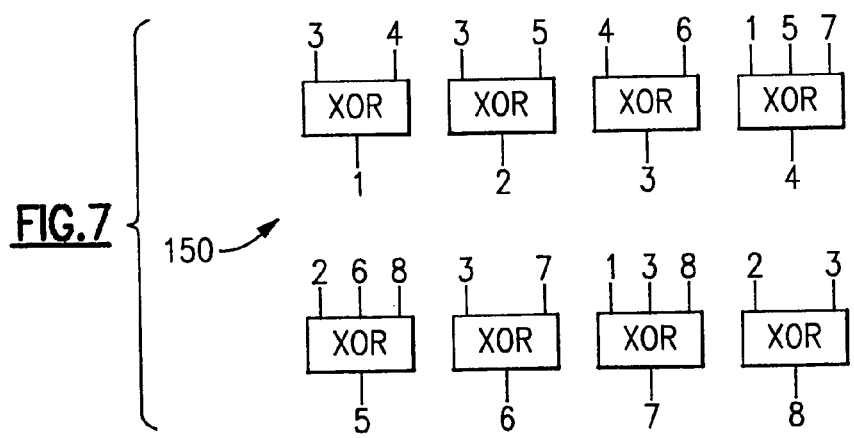
FIG. 7 is a block circuit diagram illustrating multiplication of an subsyndrome input vector by a power of a companion matrix ($T^{56}$)

FIG. 6 shows a general block diagram for a circuit 140 for generating a data symbol error indicator $L_1$ and for error correction of data symbol i. Inputs A(i) and B(i) in FIG. 6 are 8-bit patterns each representing a component of the syndrome, and T(i) is one of the 3 submatrices of the symbol column i of Equation 3. The specifications of A(i), B(i) and T(i) are shown in Table 4. Using the notations of the previous paragraph, A(i) is $S_{i_j}$, B(i) is $S_{i_j}$, and T(i) is $T_{i_k}$. The multiplication of T(i) by an 8-bit input vector is illustrated by circuit 150 as shown in FIG. 7 for the case that $T(i)=T^{56}$ (see Table 1 below for a detailed specification of the powers of T). Note that output for bit position #1 is the XOR of input bits 3 and 4, which correspond to the positions of ones in the first row of binary matrix $T^{56}$. If $L_1$=1, then B(i) is the symbol error pattern E, and the symbol data received should be inverted at positions indicated by B(i), as shown in FIG. 6.

Figure 8:
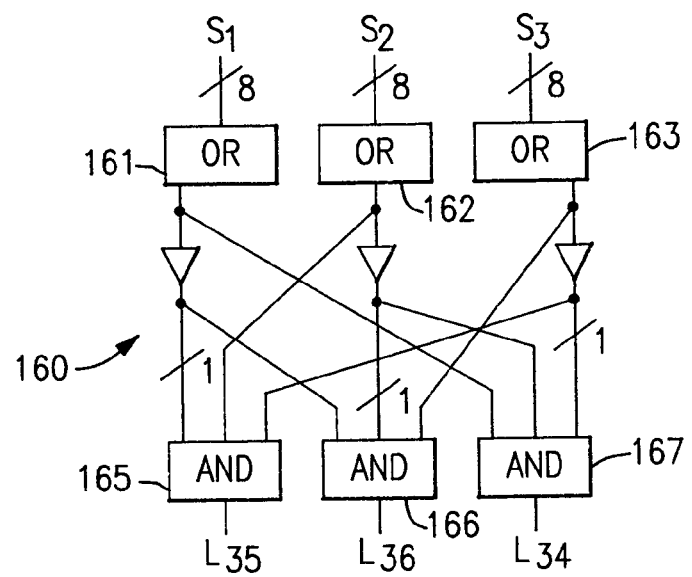
FIG. 8 is a block circuit diagram illustrating the generation of check symbol error indicators ($L_{35}$, $L_{36}$ and $L_{34}$)

FIG. 8 shows logic circuit 160, with OR gates 161, 162 and 163 and with AND gates 165, 166 and 167 connected as shown, for the generation of $L_1$ for i=34, 35 and 36. These are the symbol error indicators for the ECC check symbols. They are used together with the data symbol error indicators to generate the UE signal as shown in FIG. 9.

Figure 9:
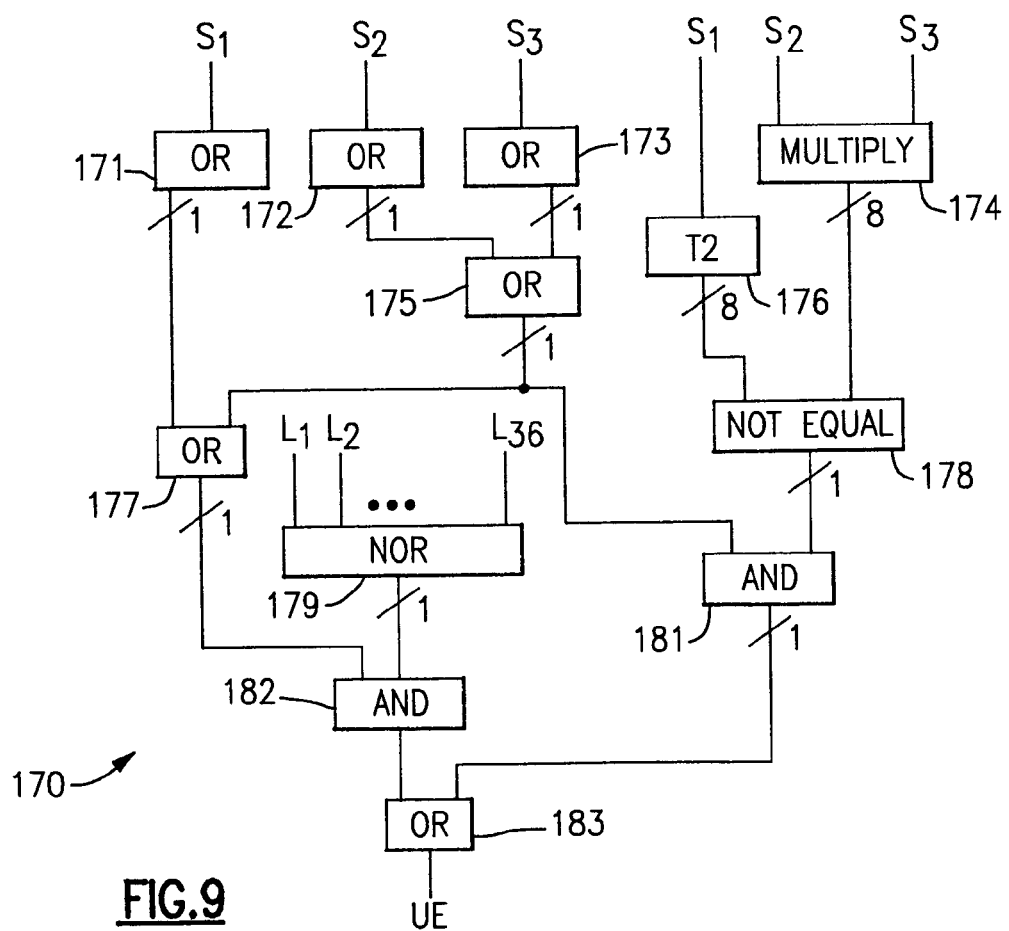
FIG. 9 is a block circuit diagram illustrating a circuit in accordance with the present invention for generating uncorrectable error (UE) indications.

FIG. 9 shows the logic for the generation of a UE signal. Logically, the UE signal line is set when either one of the following two conditions is met:

a. Syndrome S contains one or more ones and none of the 36 symbol error indicators $L_i$, $1 \leq i \leq 36$, is on; and b. $S_2 \cdot S_3 \neq T^{56} \cdot (S_1^2)$ and there is at least one "1" in $S_2$ or $S_3$.

The implementation of condition b is shown on the right-hand side of FIG. 9. The multiplication of $T^{56}$ by the square of $S_1$ is implemented by the function T2 specified in Table 5. The multiplication of $S_2$ and $S_3$ is described below.

Let $S_2=(x0, x1, x2, x3, x4, x5, x6, x7)$, let $S_3=(y0, y1, y2, y3, y4, y5, y6, y7)$ and let $R=(r0, r1, r2, r3, r4, r5, r6, r7)$ be the product of the multiplication of $S_2$ and $S_3$, respectively. Consider these 8-bit vectors as binary polynomials of degree 7. Then polynomial R is the product of polynomials $S_2$ and $S_3$ modulo p(x). Explicit formulas for the components of R can be obtained in two steps. First, the following 14 signals are generated through XOR operations on the products of the components of $S_2$ and $S_3$.

Z0=x0 ^y0 (logical AND of x0 and y0)
z1=XOR(x0 ^y1, x1 ^y0)
z2=XOR(x0 ^y2, x1 ^y1, x2 ^y0)
z3=XOR(x0 ^y3, x1 ^y2, x2 ^y1, x3 ^y0 )
z4=XOR(x0 ^y4, x1 ^y3, x2 ^y2, x3 ^y1, x4 ^y0)
z5=XOR(x0 ^y5, x1 ^y4, x2 ^y3, x3 ^y2, x4 ^y1, x5 ^y0)
z6=XOR(x0 ^y6, x1 ^y5, x2 ^y4, x3 ^y3, x4 ^y2, x5 ^y1, x6 ^y0)
x7=XOR(x0 ^y7, x1 ^y6, x2 ^y5, x3 ^y4, x4 ^y3, x5 ^y2, x6 ^y1, x7 ^y0)
x8=XOR(x1 ^y7, x2 ^y6, x3 ^y5, x4 ^y4, x5 ^y3, x6 ^y2, x7 ^y1)
x9=XOR(x2 ^y7, x3 ^y6, x4 ^y5, x5 ^y4, x6 ^y3, x7 ^y2)
x10=XOR(x3 ^y7, x4 ^y6, x5 ^y5, x6 ^y4, x7 ^y3)
x11=XOR(x4 ^y7, x5 ^y6, x6 ^y5, x7 ^y4)
x12=XOR(x5 ^y7, x6 ^y6, x7 ^y5)
x13=XOR(x6 ^y7, x7 ^y6)
x14=x7 ^y7

Next, the final output bits of R are obtained through another set of XOR operations.

r0=XOR(z0, z8, z9, z11, z12, z14)
r1=XOR(z1, z8, z10, z11, z13, z14)
r2=XOR(z2, z9, z11, z12, z14)
r3=XOR(z3, z10, z12, z13)
r4=XOR(z4, z11, z13, z14)
r5=XOR(z5, z12, z14)
r6=XOR(z6, z8, z9, z11, z12, z13, z14)
r7=XOR(z7, z8, z10, z11, z13)

Powers of T $$I = \begin{bmatrix} 10000000 \\ 01000000 \\ 00100000 \\ 00010000 \\ 00001000 \\ 00000100 \\ 00000010 \\ 00000001 \end{bmatrix} \quad T = \begin{bmatrix} 00000001 \\ 10000001 \\ 01000000 \\ 00100000 \\ 00010000 \\ 00001000 \\ 00000101 \\ 00000011 \end{bmatrix} \quad T^2 = \begin{bmatrix} 00000011 \\ 00000010 \\ 10000001 \\ 01000000 \\ 00100000 \\ 00010000 \\ 00001011 \\ 00000110 \end{bmatrix}$$

-continued

Powers of T $$T^3 = \begin{bmatrix} 00000110 \\ 00000101 \\ 00000010 \\ 10000001 \\ 01000000 \\ 00100000 \\ 00010110 \\ 00001101 \end{bmatrix} \quad T^4 = \begin{bmatrix} 00001101 \\ 00001011 \\ 00000101 \\ 00000010 \\ 10000001 \\ 01000000 \\ 00101101 \\ 00011011 \end{bmatrix} \quad T^{49} = \begin{bmatrix} 00111000 \\ 00100100 \\ 10010010 \\ 01001001 \\ 10100100 \\ 01010010 \\ 10010001 \\ 01110000 \end{bmatrix}$$

$$T^{50} = \begin{bmatrix} 01110000 \\ 01001000 \\ 00100100 \\ 10010010 \\ 01001001 \\ 10100100 \\ 00100010 \\ 11100001 \end{bmatrix} \quad T^{51} = \begin{bmatrix} 11100001 \\ 10010001 \\ 01001000 \\ 00100100 \\ 10010010 \\ 01001001 \\ 10000101 \\ 11000011 \end{bmatrix} \quad T^{52} = \begin{bmatrix} 11000011 \\ 00100010 \\ 10010001 \\ 01001000 \\ 00100100 \\ 10010010 \\ 10001010 \\ 10000110 \end{bmatrix}$$

$$T^{53} = \begin{bmatrix} 10000110 \\ 01000101 \\ 00100010 \\ 10010001 \\ 01001000 \\ 00100100 \\ 00010100 \\ 00001100 \end{bmatrix} \quad T^{54} = \begin{bmatrix} 00001100 \\ 10001010 \\ 01000101 \\ 00100010 \\ 10010001 \\ 01001000 \\ 00101000 \\ 00011000 \end{bmatrix} \quad T^{55} = \begin{bmatrix} 00011000 \\ 00010100 \\ 10001010 \\ 01000101 \\ 00100010 \\ 10010001 \\ 01010000 \\ 00110000 \end{bmatrix}$$

$$T^{56} = \begin{bmatrix} 00110000 \\ 00101000 \\ 00010100 \\ 10001010 \\ 01000101 \\ 00100010 \\ 10100001 \\ 01100000 \end{bmatrix} \quad T^{57} = \begin{bmatrix} 01100000 \\ 01010000 \\ 00101000 \\ 00010100 \\ 10001010 \\ 01000101 \\ 01000010 \\ 11000001 \end{bmatrix} \quad T^{59} = \begin{bmatrix} 10000011 \\ 01000010 \\ 10100001 \\ 01010000 \\ 00101000 \\ 00010100 \\ 00001001 \\ 00000111 \end{bmatrix}$$

$$T^{60} = \begin{bmatrix} 00000111 \\ 10000100 \\ 01000010 \\ 10100001 \\ 01010000 \\ 00101000 \\ 00010011 \\ 00001110 \end{bmatrix} \quad T^{152} = \begin{bmatrix} 00000100 \\ 10000110 \\ 11000011 \\ 11100001 \\ 01110000 \\ 00111000 \\ 00011000 \\ 00001000 \end{bmatrix} \quad T^{153} = \begin{bmatrix} 00001000 \\ 00001100 \\ 10000110 \\ 11000011 \\ 11100001 \\ 01110000 \\ 00110000 \\ 00010000 \end{bmatrix}$$

$$T^{154} = \begin{bmatrix} 00010000 \\ 00011000 \\ 00001100 \\ 10000110 \\ 11000011 \\ 11100001 \\ 01100000 \\ 00100000 \end{bmatrix} \quad T^{155} = \begin{bmatrix} 00100000 \\ 00110000 \\ 00011000 \\ 00001100 \\ 10000110 \\ 11000011 \\ 11000001 \\ 01000000 \end{bmatrix} \quad T^{156} = \begin{bmatrix} 01000000 \\ 01100000 \\ 00110000 \\ 00011000 \\ 00001100 \\ 10000110 \\ 10000011 \\ 10000001 \end{bmatrix}$$

-continued

Powers of T $$T^{157} = \begin{bmatrix} 10000001 \\ 11000001 \\ 01100000 \\ 00110000 \\ 00011000 \\ 00001100 \\ 00000111 \\ 00000010 \end{bmatrix} \quad T^{158} = \begin{bmatrix} 00000010 \\ 10000011 \\ 11000001 \\ 01100000 \\ 00110000 \\ 00011000 \\ 00001110 \\ 00000101 \end{bmatrix} \quad T^{159} = \begin{bmatrix} 00000101 \\ 00000111 \\ 10000011 \\ 11000001 \\ 01100000 \\ 00110000 \\ 00011101 \\ 00001011 \end{bmatrix}$$

$$T^{227} = \begin{bmatrix} 10001111 \\ 11001000 \\ 11100100 \\ 01110010 \\ 10111001 \\ 01011100 \\ 00100001 \\ 00011111 \end{bmatrix} \quad T^{251} = \begin{bmatrix} 11111111 \\ 00000100 \\ 10000010 \\ 01000001 \\ 10100000 \\ 11010000 \\ 00010000 \\ 11110000 \end{bmatrix} \quad T^{252} = \begin{bmatrix} 11110000 \\ 00001000 \\ 00000100 \\ 10000010 \\ 01000001 \\ 10100000 \\ 00100000 \\ 11100000 \end{bmatrix}$$

$$T^{254} = \begin{bmatrix} 11000000 \\ 00100000 \\ 00010000 \\ 00001000 \\ 00000100 \\ 10000010 \\ 10000001 \\ 10000000 \end{bmatrix}$$

TABLE 2

T1 Specification

| Output Bits | XOR of Input Bits |
|---|---|
| 1 | 5, 6, 8 |
| 2 | 5, 7, 8 |
| 3 | 6, 8 |
| 4 | 7 |
| 5 | 1, 8 |
| 6 | 2 |
| 7 | 3, 5, 6, 8 |
| 8 | 4, 5, 7, 8 |
| 9 | 13, 14, 16 |
| 10 | 13, 15, 16 |
| 11 | 14, 16 |
| 12 | 15 |
| 13 | 9, 16 |
| 14 | 10 |
| 15 | 11, 13, 14, 16 |
| 16 | 12, 13, 15, 16 |
| 17 | 21, 22, 24 |
| 18 | 21, 23, 24 |
| 19 | 22, 24 |
| 20 | 23 |
| 21 | 17, 24 |
| 22 | 18 |
| 23 | 19, 21, 22, 24 |
| 24 | 20, 21, 23, 24 |

TABLE 3

Matrix H1 (part 1 of 4)

| row # | columns 1–36 |
|---|---|
| 1 | 1000 1000 1000 1000 1000 1000 1000 1000 1000 |
| 2 | 0100 0100 0100 0100 0100 0100 0100 0100 0100 |
| 3 | 0010 0010 0010 0010 0010 0010 0010 0010 0010 |
| 4 | 0001 0001 0001 0001 0001 0001 0001 0001 0001 |
| 5 | 0000 0000 0000 0000 0000 0000 0000 0000 0000 |
| 6 | 0000 0000 0000 0000 0000 0000 0000 0000 0000 |
| 7 | 0000 0000 0000 0000 0000 0000 0000 0000 0000 |
| 8 | 0000 0000 0000 0000 0000 0000 0000 0000 0000 |
| 9 | 1000 0000 0000 0000 0000 0100 1000 0000 0000 |
| 10 | 0100 1000 0000 0000 0000 0110 1100 1000 0000 |
| 11 | 0010 0100 1000 0000 0000 0011 0110 1100 1000 |
| 12 | 0001 0010 1000 0000 0000 0001 0011 0110 1100 |
| 13 | 0000 0001 0010 0100 1000 0000 0001 0011 0110 |
| 14 | 0000 0000 0001 0010 0100 1000 0000 0001 0011 |
| 15 | 0000 0000 0000 0001 0010 1000 0000 0000 0001 |
| 16 | 0000 0000 0000 0000 0001 1000 0000 0000 0000 |
| 17 | 0011 0001 0000 1000 1100 0010 0001 0000 0000 |
| 18 | 0010 0001 1000 0100 0010 0011 0001 0000 1000 |
| 19 | 0001 1000 0100 0010 1001 0001 0000 1000 1100 |
| 20 | 1000 0100 0010 1001 0100 1000 1000 1100 1110 |
| 21 | 0100 0010 1001 0100 0010 1000 1100 1110 0111 |
| 22 | 0010 1001 0100 0010 1001 1100 1110 0111 0011 |
| 23 | 1010 0101 0010 0001 1000 1100 0110 0011 0001 |
| 24 | 0110 0011 0001 0000 1000 0100 0010 0001 0000 |

Matrix H1 (part 2 of 4)

| row # | columns 37–72 |
|---|---|
| 1 | 1000 1000 1000 0000 0011 0111 1110 1000 1000 |
| 2 | 0100 0100 0100 0100 0010 0100 1001 1100 0100 |
| 3 | 0010 0010 0010 1000 1001 0010 0100 1110 0010 |
| 4 | 0001 0001 0001 0100 0100 1001 0010 0111 0001 |
| 5 | 0000 0000 0000 0010 1010 0100 1001 1011 0000 |
| 6 | 0000 0000 0000 0001 0101 1010 0100 0101 0000 |
| 7 | 0000 0000 0000 0000 1001 0010 0100 0010 0000 |
| 8 | 0000 0000 0000 0111 1110 1100 0001 0000 |
| 9 | 1111 1111 1100 1000 1000 1000 1000 1000 0011 |
| 10 | 0000 0000 0010 0100 0100 0100 0100 0100 0010 |
| 11 | 1000 0000 0001 0010 0010 0010 0010 0010 0001 |
| 12 | 0100 1000 0000 0001 0001 0001 0001 0001 1000 |
| 13 | 1010 0100 0000 0000 0000 0000 0000 0000 0100 |
| 14 | 1101 1010 1000 0000 0000 0000 0000 0000 0010 |
| 15 | 0001 0010 1000 0000 0000 0000 0000 0000 1010 |
| 16 | 1111 1110 1000 0000 0000 0000 0000 0000 0110 |
| 17 | 0000 1000 0110 0000 0001 0100 1000 1000 1000 |
| 18 | 1000 0100 0101 1000 0001 0110 1000 0100 0100 |
| 19 | 0100 1010 0010 0100 0000 0011 1100 0010 0010 |
| 20 | 1010 0101 0001 1010 1000 0001 0110 0001 0001 |
| 21 | 0101 0010 0001 0101 1100 0000 0011 0001 0001 |
| 22 | 0010 0001 0100 0010 1110 1000 0001 0000 0000 |
| 23 | 0001 0000 0100 0001 0110 1000 0000 0000 0000 |
| 24 | 0000 0000 1100 0000 0010 1000 0000 0000 0000 |

Matrix H1 (part 3 of 4)

| row # | columns 73–108 |
|---|---|
| 1 | 1000 1000 1000 1000 1000 1000 1000 1000 1000 |
| 2 | 0100 0100 0100 0100 0100 0100 0100 0100 0100 |
| 3 | 0010 0010 0010 0010 0010 0010 0010 0010 0010 |
| 4 | 0001 0001 0001 0001 0001 0001 0001 0001 0001 |
| 5 | 0000 0000 0000 0000 0000 0000 0000 0000 0000 |
| 6 | 0000 0000 0000 0000 0000 0000 0000 0000 0000 |
| 7 | 0000 0000 0000 0000 0000 0000 0000 0000 0000 |
| 8 | 0000 0000 0000 0000 0000 0000 0000 0000 0000 |
| 9 | 0001 0000 1000 1100 0010 0001 0000 0000 0000 |
| 10 | 0001 1000 0100 0010 0011 0001 0000 1000 1000 |
| 11 | 1000 0100 0010 1001 0001 0000 1000 1100 0100 |
| 12 | 0100 0010 1001 0100 0000 1000 1100 1110 1010 |
| 13 | 0010 1001 0100 0010 1000 1100 1110 0111 0101 |
| 14 | 1001 0100 0010 1001 1100 1110 0111 0011 0010 |
| 15 | 0101 0010 0001 1000 1100 0110 0011 0001 0001 |
| 16 | 0011 0001 0000 0100 0010 0001 0000 0000 0000 |
| 17 | 0000 0000 0000 0000 0100 1000 0000 0000 1111 |
| 18 | 1000 0000 0000 0000 0110 1100 1000 0000 0000 |
| 19 | 0100 1000 0000 0000 0011 0110 1100 1000 1000 |
| 20 | 0010 0100 1000 0000 0001 0011 0110 1100 0100 |
| 21 | 0001 0010 0100 1000 0000 0001 0011 0110 1010 |
| 22 | 0000 0001 0010 0100 1000 0000 0001 0011 1101 |
| 23 | 0000 0000 0001 0010 1000 0000 0000 0001 0001 |
| 24 | 0000 0000 0000 0001 1000 0000 0000 0000 1111 |

Matrix H1 (part 4 of 4)

| row # | columns 109–144 |
|---|---|
| 1 | 1000 1000 0000 0011 0111 1110 1000 0000 0000 |
| 2 | 0100 0100 0000 0010 0100 1001 0100 0000 0000 |
| 3 | 0010 0010 1000 1001 0010 0100 0010 0000 0000 |
| 4 | 0001 0001 0100 0100 1001 0010 0001 0000 0000 |
| 5 | 0000 0000 0010 1010 0100 1001 0000 0000 0000 |
| 6 | 0000 0000 0001 0101 1010 0100 0000 0000 0000 |
| 7 | 0000 0000 0000 1001 0010 0100 0000 0000 0000 |
| 8 | 0000 0000 0000 0111 1110 1100 0000 0000 0000 |
| 9 | 1000 0110 0000 0001 0100 0000 0000 1000 0000 |
| 10 | 0100 0101 1000 0001 0110 1000 0000 0100 0000 |
| 11 | 1010 0010 0100 0000 0011 1100 0000 0010 0000 |
| 12 | 0101 0001 1010 1000 0001 0110 0000 0001 0000 |
| 13 | 0010 1000 0101 1100 0000 0011 0000 0000 0000 |
| 14 | 0001 0100 0010 1110 1000 0001 0000 0000 0000 |
| 15 | 0000 0100 0001 0110 1000 0000 0000 0000 0000 |
| 16 | 0000 1100 0000 0010 1000 0000 0000 0000 0000 |
| 17 | 1111 1100 1000 1000 1000 1000 0000 0000 1000 |
| 18 | 0000 0010 0100 0100 0100 0100 0000 0000 0100 |
| 19 | 0000 0001 0010 0010 0010 0010 0000 0000 0010 |
| 20 | 1000 0000 0001 0001 0001 0001 0000 0000 0001 |
| 21 | 0100 0000 0000 0000 0000 0000 0000 0000 0000 |
| 22 | 1010 1000 0000 0000 0000 0000 0000 0000 0000 |
| 23 | 0010 1000 0000 0000 0000 0000 0000 0000 0000 |
| 24 | 1110 1000 0000 0000 0000 0000 0000 0000 0000 |

TABLE 4

Parameters for FIG. 6

| Symbol Location i | A(i) | B(i) | T(i) |
|---|---|---|---|
| 1 | $S_2$ | $S_1$ | $I$ |
| 2 | $S_2$ | $S_1$ | $T$ |
| 3 | $S_2$ | $S_1$ | $T^2$ |
| 4 | $S_2$ | $S_1$ | $T^3$ |
| 5 | $S_2$ | $S_1$ | $T^4$ |
| 6 | $S_3$ | $S_1$ | $T^{155}$ |
| 7 | $S_3$ | $S_1$ | $T^{154}$ |
| 8 | $S_3$ | $S_1$ | $T^{153}$ |
| 9 | $S_3$ | $S_1$ | $T^{152}$ |
| 10 | $S_3$ | $S_1$ | $T^{60}$ |
| 11 | $S_2$ | $S_1$ | $T^{252}$ |
| 12 | $S_2$ | $S_1$ | $T^{254}$ |
| 13 | $S_1$ | $S_2$ | $T^2$ |
| 14 | $S_3$ | $S_2$ | $T^{154}$ |
| 15 | $S_3$ | $S_2$ | $T^{156}$ |
| 16 | $S_3$ | $S_2$ | $T^{158}$ |
| 17 | $S_3$ | $S_2$ | $I$ |
| 18 | $S_3$ | $S_1$ | $I$ |
| 19 | $S_3$ | $S_1$ | $T$ |
| 20 | $S_3$ | $S_1$ | $T^2$ |
| 21 | $S_3$ | $S_1$ | $T^3$ |
| 22 | $S_3$ | $S_1$ | $T^4$ |
| 23 | $S_2$ | $S_1$ | $T^{155}$ |
| 24 | $S_2$ | $S_1$ | $T^{154}$ |
| 25 | $S_2$ | $S_1$ | $T^{153}$ |
| 26 | $S_2$ | $S_1$ | $T^{152}$ |
| 27 | $S_2$ | $S_1$ | $T^{60}$ |
| 28 | $S_3$ | $S_1$ | $T^{252}$ |
| 29 | $S_3$ | $S_1$ | $T^{254}$ |
| 30 | $S_1$ | $S_3$ | $T^2$ |

TABLE 4-continued

Parameters for FIG. 6

| Symbol Location i | A(i) | B(i) | T(i) |
|---|---|---|---|
| 31 | $S_2$ | $S_3$ | $T^{154}$ |
| 32 | $S_2$ | $S_3$ | $T^{156}$ |
| 33 | $S_2$ | $S_3$ | $T^{158}$ |

TABLE 5

T2 Specification

| Output Bits | XOR of Input Bits |
|---|---|
| 1 | 2, 6, 8 |
| 2 | 2, 3, 7 |
| 3 | 6, 8 |
| 4 | 1, 3, 4, 8 |
| 5 | 7 |
| 6 | 2, 4, 5 |
| 7 | 1, 2, 6 |
| 8 | 2, 5, 6, 7 |

From the above, it is seen that various ones of the embodiments of the present invention meet the objectives indicated. In particular, it is seen that a single symbol error correction and double symbol error detection code exists in a form which can implemented in a plurality of cycles. It is also seen that such a code can be constructed in a way in which error indications for individual symbols are producible in a simpler, faster and less expensive fashion. It is also seen that both syndrome generation and check bit generation circuitry is improved as well.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for operating signal processing hardware to provide an error indication for the $i^{th}$ symbol in an error correction system for single symbol error correction and double symbol error detection using powers of the companion matrix associated with a primitive polynomial of degree m, said method comprising the steps of:

multiplying a first, predetermined subportion of a generated syndrome vector by a predetermined power of the companion matrix; and comparing the result of said multiplication with a second, different subpart of said syndrome vector.

2. The method of claim 1 further including the step of generating a signal indicating that said $i^{th}$ symbol is in error when said comparison indicates a match.

3. The method of claim 1 in which said multiplication and comparison steps are carried out for all symbol positions.

4. The method of claim 2 further including the step of correcting at least one error in said $i^{th}$ symbol, said method further including forming a bitwise exclusive-or operation between bits in said $i^{th}$ symbol and bits in said first syndrome whenever said comparison indicates an error and said bits in said first syndrome are not all zero.

5. The method of claim 4 in which said correcting is carried out for all symbol positions.

6. A circuit for providing an error indication for the $i^{th}$ symbol in an error correction system for single symbol error correction and double symbol error detection using powers of the companion matrix associated with a primitive polynomial of degree m, said circuit comprising:

a multiplier which multiplies a first, predetermined subportion of a generated syndrome vector by a predetermined power of the companion matrix, said multiplication being modulo 2; and a comparator circuit which compares the result of said multiplication with a second, different subpart of said syndrome vector, whereby a signal is generated indicating an error in the $i^{th}$ symbol position when said comparison indicates a match.

7. An error indication circuit for the code system of claim 6 in which said multiplier and comparator circuits are provided for each symbol.

8. The circuit of claim 6 further including, for correcting at least one error in said $i^{th}$ symbol, a set of bitwise exclusive-or gates for adding, in modulo 2 form, bits in said $i^{th}$ symbol to bits in said first syndrome whenever said comparator circuit indicates an error and said bits in said first syndrome are not all zero.

9. An error indication circuit for the circuit and code system of claim 8 in which said exclusive-or gates for addition are provided for each symbol.

10. A digital electric circuit for generating check symbols for a single symbol error correction and double symbol error detection code for binary information, said circuit having an input-to-output relation characterized by a binary parity check matrix of the form $H=[M_1, M_2, I]$, where I is an identity matrix with 3 m rows and with 3 m columns and where each of $M_1$ and $M_2$ are arrays of submatrices which include at least three submatrix rows wherein each said submatrix row comprises identity matrices with m rows and with m columns and which also comprises distinct powers of an m'm submatrix T which is a companion matrix associated with a primitive binary polynomial of degree m and where the last two submatrix rows in $M_2$ are, except for the last column of submatrices in $M_1$, the same as the last submatrix row and the next to last submatrix row respectively of the submatrices of $M_1$.

11. A method for generating check symbols for a single symbol error correction and double symbol error detection code for binary information, said method comprising the step of supplying said binary information to a circuit having an input-to-output relation characterized by a binary parity check matrix of the form $H=[M_1, M_2, I]$, where I is an identity matrix with 3 m rows and with 3 m columns and where each of $M_1$ and $M_2$ are arrays of submatrices which include at least three submatrix rows wherein each said submatrix row comprises identity matrices with m rows and with m columns and which also comprises distinct powers of an m'm submatrix T which is a companion matrix associated with a primitive binary polynomial of degree m and where the last two submatrix rows in $M_2$ are, except for the last column of submatrices in $M_1$, the same as the last submatrix row and the next to last submatrix row respectively of the submatrices of $M_1$.

12. A digital electric circuit for generating check symbols for a single symbol error correction and double symbol error detection code for binary information, said circuit having an input-to-output relation characterized by a binary parity check matrix of the form $H=[M_1, M_2, I]$, where I is an identity matrix with 3 m rows and with 3 m columns and where each of $M_1$ and $M_2$ are arrays of submatrices which include at least three submatrix rows wherein each said submatrix row comprises identity matrices with m rows and with m columns and which also comprises distinct powers of an m'm submatrix T which is a companion matrix associated with a primitive binary polynomial of degree m and wherein, within $M_1$ and $M_2$, there is at least one column of three submatrices in which the product of the last two submatrices is equal to the square of the first submatrix times a power of said companion matrix.

13. The circuit of claim 12 in which, within $M_1$ and $M_2$, there are a plurality of columns of three submatrices, in which the product of the last two submatrices is equal to the square of the first submatrix times a power of said companion matrix.

14. A method for generating check symbols for a single symbol error correction and double symbol error detection code for binary information, said method comprising the step of supplying said binary information to a circuit having an input-to-output relation characterized by a binary parity check matrix of the form H=[$M_1$, $M_2$, I], where I is an identity matrix with 3 m rows and with 3 m columns and where each of $M_1$ and $M_2$ are arrays of submatrices which include at least three submatrix rows wherein each said row comprises identity matrices with m rows and with m columns and which also comprise distinct powers of an m'm submatrix T which is a companion matrix associated with a primitive binary polynomial of degree m and wherein, within $M_1$ and $M_2$, there is at least one column of three submatrices in which the product of the last two submatrices is equal to the square of the first submatrix times a power of said companion matrix.

15. The method of claim 14 in which, within $M_1$ and $M_2$, there are a plurality of columns of three submatrices, in which the product of the last two submatrices is equal to the square of the first submatrix times a power of said companion matrix.

* * * * *